United States Patent [19]

Matsubara

[11] Patent Number: 5,640,104
[45] Date of Patent: Jun. 17, 1997

[54] SIGNAL RECEIVER IN AN INTERFACE

[75] Inventor: Yasushi Matsubara, Tokyo, Japan

[73] Assignee: NEC Corporation, Tokyo, Japan

[21] Appl. No.: 534,030

[22] Filed: Sep. 26, 1995

[30] Foreign Application Priority Data

Sep. 26, 1994 [JP] Japan ................................ 6-229309

[51] Int. Cl.⁶ ........................................... H03K 17/30
[52] U.S. Cl. ............................ 326/34; 326/24; 327/206
[58] Field of Search .............................. 326/112, 121, 326/24, 21, 34; 327/54, 87, 206

[56] References Cited

U.S. PATENT DOCUMENTS

| | | | |
|---|---|---|---|
| 4,926,068 | 5/1990 | Fujita | 327/205 |
| 5,107,137 | 4/1992 | Kinugasa | 327/206 |
| 5,362,994 | 11/1994 | Lin | 327/206 |
| 5,444,413 | 8/1995 | Kimura | 327/562 |
| 5,459,437 | 10/1995 | Campbell | 327/206 |
| 5,463,339 | 10/1995 | Riggio | 327/206 |

*Primary Examiner*—David R. Hudspeth
*Assistant Examiner*—Benjamin D. Driscoll
*Attorney, Agent, or Firm*—Foley & Lardner

[57] ABSTRACT

A signal receiver for an interface of an MPU or a memory has a differential amplifier for receiving an input signal from an input/output line for the IPU and the memory, an inverter for receiving the output of the differential amplifier, and a feed-back section for providing the signal receiver with a transfer characteristic having a hysteresis with respect to the input signal of tile signal receiver. The feed-back section includes a feed-back signal path and a feed-back current path formed between a supply line and the output of the differential amplifier. The output signal of the gate is feed-backed to the feed-back current path as a control signal for making the feed-back current path active or inactive to shift tile voltage level of the output of the differential amplifier. The gate is not operated by a transient oscillation of the input signal so that unnecessary power consumption due to tile transient oscillation of the input of tile signal receiver is avoided.

5 Claims, 7 Drawing Sheets

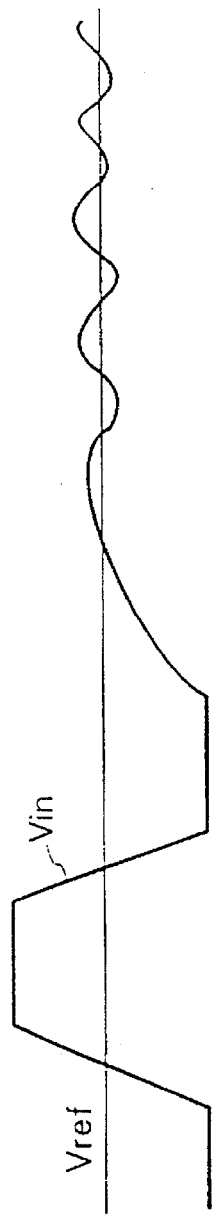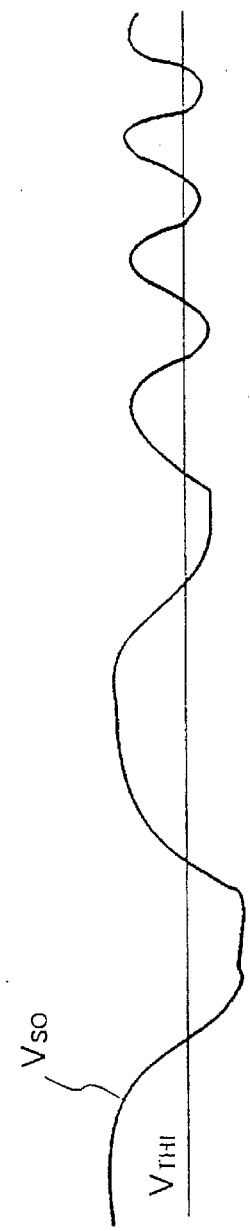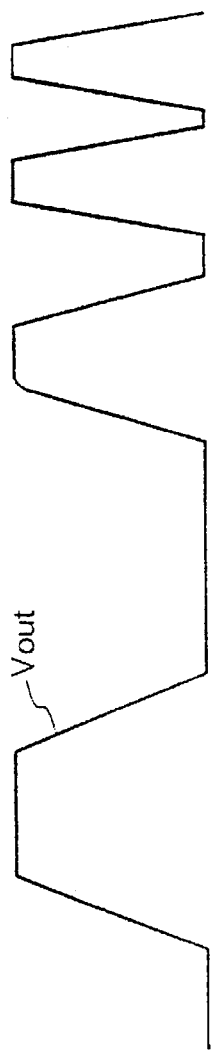
FIG. 2A
FIG. 2B
FIG. 2C

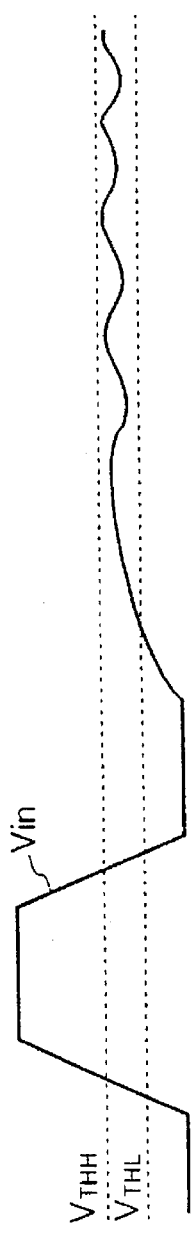
FIG. 4A
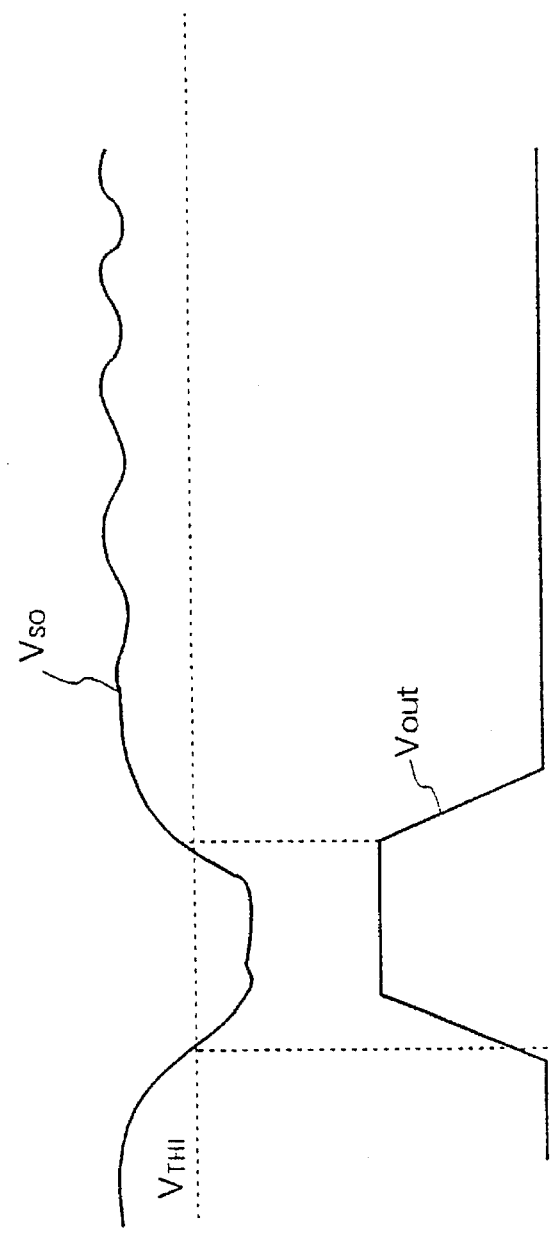
FIG. 4B
FIG. 4C (a)

(b)

SIGNAL RECEIVER IN AN INTERFACE

BACKGROUND OF THE INVENTION (a) Field of the Invention

The present invention relates to a signal receiver for receiving data in an interface of a micro-processing unit (MPU), a memory and so forth from an input/output line.

(b) Description of the Related Art

With the increase of operating frequency in an MPU up to 50 MHz, a limit has appeared, from the viewpoint of electric power consumption or switching noise, in a conventional interface which connects the MPU, a memory and so forth with an input/output line and has been used for a long time. In such a situation, i is important to develop a new interface operating in a high-speed. Some interfaces capable of operating in a high-speed are proposed recently. One of those is especially expected to be an interface operating in a high speed. FIGS. 1A, 1B and 1C show the proposed interface, a driver and a signal receiver in the interface, respectively.

In FIG. 1A, the signal transmission circuit connecting an MPU 501 to a plurality of memories 502 is comprised of interfaces each including a pair of driver 503 and signal receiver 504 and provided in the MPU 501 and the respective memories 502, a referential voltage power supply line 506, an input/output line 508 and terminating resistors R1.

The MPU 501 and each of the memories 502 transmit data between them by using the drivers 503, signal receivers 504 and input/output line 508. For example, the data is transmitted from the driver 503 in the MPU 501 to the input/output line 508, from which the data is read by the signal receiver 504 in tile memory 502 provided specifically for receiving data from the input/output line 508.

The terminating resistors R1 are connected between the input/output line 508 and the referential voltage supply line 506 at both ends of the input/output line 508, in order to avoid noise generated by signal reflection at the terminals of the input/output line 508.

Now, examples of actual circuits of the conventional driver 503 and signal receiver 504 will be described with reference to FIG. 1B and FIG. 1C, respectively.

In FIG. 1B, the driver 503, referred to as a three-state buffer, is comprised of two field effect transistors Q41 and Q42. The source of the p-channel (p-ch) transistor Q41 is connected to a power supply line $V_{cc}$, while the source of n-ch transistor Q42 is connected to the ground GND. Each of the gates of transistors Q41 and Q42 is connected to a signal line receiving an input signal $V_{DIN}$. Both the drains of transistors Q41 and Q42 are connected together to the input/output line 508.

In the configurations as described above, when a low-level signal $V_{DIN}$ is input to turn transistor Q41 on and transistor Q42 off, an output voltage having nearly the same potential as that of the supply line $V_{cc}$ is output to the input/output line 508. On the other hand, when a high-level signal is input to turn transistor Q42 on and transistor Q41 off, an output voltage having nearly the same potential as the ground potential GND is output to the input/output line 508. Further, if a high- or low-level signal is not supplied to the driver input line, both transistors Q41 and Q42 are turned off, so that the output of the driver 503 is kept at a high impedance state. Data are thus transmitted from the driver 503 to the input/output line 508.

In FIG. 1C, the signal receiver 504 is comprised of a differential amplifier 522 and an inverter 521 receiving the output of the differential amplifier 522. The differential amplifier 522 includes p-oh transistors Q53 and Q58 each having a gate receiving an activation signal. PSW by which the differential amplifier 522 is turned active or inactive, and p-ch transistors Q54, Q59 and n-ch transistors Q55, Q60 constituting the body of the differential amplifier 522. Each of the sources of transistors Q53 and Q58 is connected to the power supply line $V_{cc}$, and the drains off transistor Q53 and Q58 are connected to the sources of transistors Q54 and Q59, respectively. When the receiver 504 is to be activated, transistors Q53 and Q58 are turned on by lowering the activation signal PSW at a low level to supply the electric power to transistors Q54, Q55, Q59 and Q60 constituting the body of the differential amplifier 522. On the other hand; when the signal receiver 504 is not to be activated, the signal receiver 504 is kept at a high impedance state by raising the activation signal PSW at a high level.

Each of the sources of transistors Q55 and Q60 of the differential amplifier 522 is connected to the ground GND. The gate of transistor Q55 is connected to the input/output line 508, and an input signal $V_{in}$ for the receiver 504 is supplied thereto. The referential voltage supply line 506 is connected to the gate of transistor Q60, and the referential voltage $V_{ref}$ is supplied thereto. The drains of transistors Q59 and Q60 and the gates of transistors Q54 and Q59 are connected together, respectively. Each of the drains of transistors Q54 and Q55 are connected together to an output 520 of the differential amplifier 522. The output 520 of the differential amplifier 522 is connected to an input to the inverter 521, the output of which is connected to the internal circuit (not shown) of corresponding one of memories and MPU in the system.

In operation, the differential amplifier 522 detects, with a high sensitivity, very small potential difference between the potential of the input signal $V_{in}$ from the input/output line 508 and the referential voltage $V_{ref}$, amplifies the small potential difference and outputs an output signal $V_{so}$ through the output 520 of the differential amplifier 522. When the input signal $V_{in}$ is higher than the referential voltage $V_{ref}$, a low level is output as the output signal $V_{so}$ of the differential amplifier 522. On the contrary, when the input signal $V_{in}$ is lower than the referential voltage $V_{ref}$, a high level is output as the output signal $V_{so}$ of the differential amplifier 522. The output signal $V_{so}$ of the differential amplifier 522 is supplied to the inverter 521, the output $V_{out}$ of which is transmitted to the internal circuits of the MPU or memories.

When data is transmitted between the MPU 501 arid one of the memories 502, only the driver 503 or the receiver 504 of the one of the memories is activated, and the other drivers 503 and receivers 504 are not activated in the other memories 502. At that time, each of the drivers 503 and receivers 504 which are not activated is kept at a high impedance state. Also, in the one of the memories 502, while the driver 503 is activated, the receiver 504 is kept inactive to have a high impedance state. On the contrary, while the receiver 504 is activated, the driver 503 is kept inactive to have a high impedance state.

In operation of the conventional signal receiver as described above, when all the transistors in all of the drivers connected to the input/output line 508 are off, that is, when the input/output line 508 is not clamped to $V_{cc}$ or ground potential GND, a problem is involved therein from the viewpoint of electric power consumption. The problem is such that, when all of the transistors in the drivers 503 connected to the input/output line 508 are turned off, unnecessary transient oscillation is induced with the center of amplitude being around the referential voltage $V_{ref}$.

FIG. 2A, 2B and 2C show the situation as described above, FIG. 2A showing the waveform of the input signal $V_{in}$, FIG. 2B showing the output $V_{so}$ of the differential circuit and FIG. 2C showing the output $V_{out}$ of the inverter. At this time, the transient oscillation on the input/output line is amplified in the output $V_{so}$ of the differential amplifier, so that the output $V_{so}$ also has an unnecessary transient oscillation as shown in FIG. 2B. Further, the output $V_{out}$ from the inverter has a corresponding transient oscillation as shown in FIG. 2C.

The potential of the transient oscillation on the input/output line 508 resides around the referential voltage $V_{ref}$. It may be considered that, in order to avoid signal transition of the output signal caused by the transient oscillation, even if the transient oscillation described above is induced, the differential amplifier should not respond to the oscillation so that the output $V_{out}$ from the inverter should be kept at a high or a low potential. However, in the conventional signal receiver, the above described problem cannot be avoided since the differential amplifier is designed to amplify, with a high sensitivity, a very small potential difference between the potential of the input signal $V_{in}$ and the referential voltage $V_{ref}$.

The unnecessary transient oscillation causes unnecessary electric power consumption in the inverter and the other inverters or the like connected thereto. Thus, it is a serious problem in a semiconductor device which is required a low electric power consumption. For example, the current power consumption may reach a few mili-amperes (mA) even in a memory product such as a dynamic RAM designed to suppress a standby current below at a level of several tens of micro-amperes (μA).

SUMMARY OF THE INVENTION

It is therefore an object of the present invention to provide a signal receiver for an interface which can reduce the unnecessary current consumption caused by a transient oscillation.

The signal receiver according to the present invention is formed such that the output of the differential amplifier is provided with a first positive feedback section and/or a second positive feedback section to obtain the transfer characteristic of the signal receiver having a hysteresis with respect to the input signal supplied thereto.

The transient oscillation is avoided in the output by introducing the hysteresis such that the instantaneous potential of the transient oscillation generated in the input signal remains within the width of the hysteresis loop of the signal receiver so that the inverter does not respond to the transient oscillation.

The above and further objects as well as features and advantages of the present invention will be apparent from the following description of the preferred embodiments of the present invention as illustrated in the accompanying drawings.

BRIEF DESCRIPTION OF THE DRAWINGS

FIGS. 2A, 2B and 2C are timing charts of an input signal of the differential amplifier, an output signal of the differential amplifier and an output signal of the inverter, respectively, shown in FIG. 1A;

FIGS. 4A, 4B and 4C are timing charts of an input signal of the differential amplifier shown with respect to trigger thresholds $V_{THH}$ and $V_{THL}$, an output signal of the differential amplifier with respect to threshold $V_{THI}$ of the inverter and an output signal of the inverter, respectively, shown in FIG. 3A;

DESCRIPTION OF THE PREFERRED EMBODIMENTS

Now, embodiments in accordance with the present invention will be described with reference to the drawings.

Figure 3A:
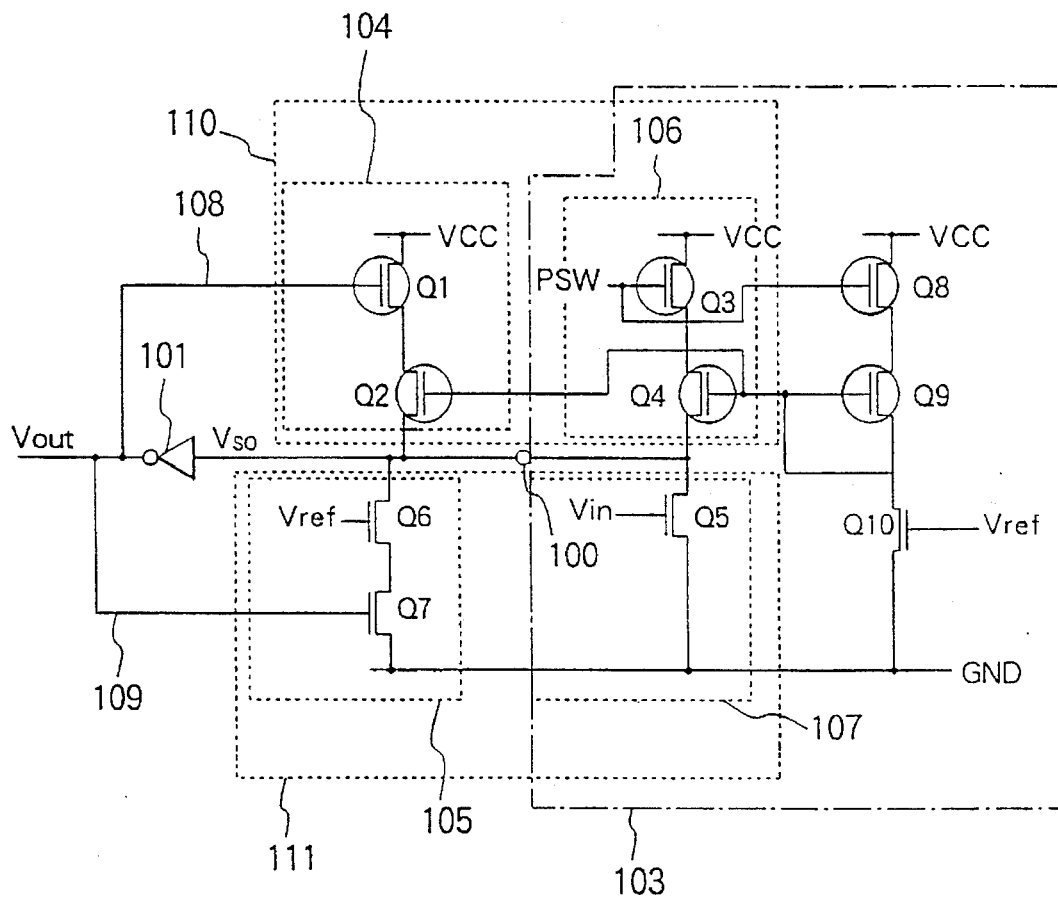
FIG. 3A is a schematic diagram of a signal receiver in an interface according to a first embodiment of the present invention.
Figure 3B:
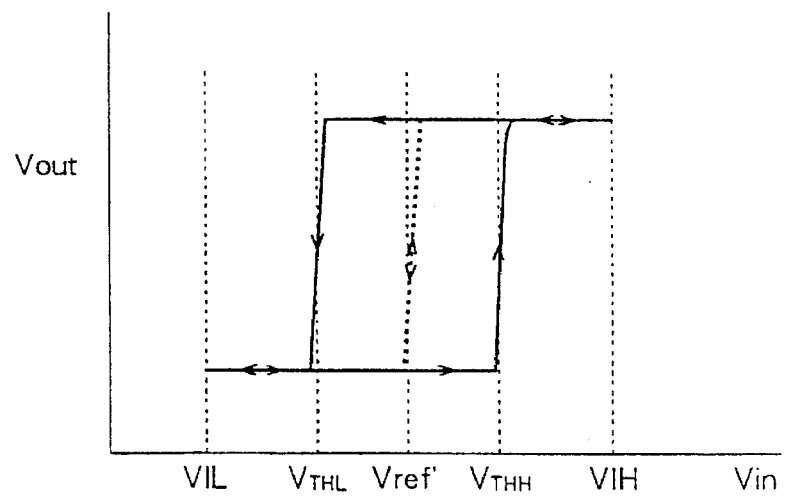
FIG. 3B is a transfer characteristic diagram of the signal receiver of FIG. 3A having a hysteresis with respect to the input signal.

FIG. 3A shows a signal receiver for an interface according to a first embodiment of the present invention, while FIG. 3B shows a transfer characteristic diagram of the signal receiver having a hysteresis with respect to an input signal. FIGS. 4A, 4B and 4C show timing charts of an input signal and an output signal of the differential amplifier and an output signal of the inverter, respectively, shown in FIG. 3A. The signal receiver can be used, for example, in the interface shown in FIG. 1A.

In FIG. 3A, the signal receiver according to the present embodiment is comprised of a differential amplifier 103, a first positive feed-back section including a first feed-back current path 104 and a feed-back signal path 108, a second positive feed-back section including a second feed-back current path 105 and a second feed-back signal path 109, and an inverter 101 receiving the output $V_{so}$ of the differential amplifier 103. The differential amplifier 103 includes p-ch transistors Q3 and Q8 each having a gate receiving an activation signal PSW by which the differential amplifier 103 is turned active or inactive, and p-ch transistors Q4, Q9 and n-ch transistors Q5, Q10 constituting the body of the differential amplifier 103. Each of the sources of transistors Q3 and Q8 is connected to the power supply line $V_{cc}$, and each of the gates of transistors Q3 and Q8 is connected to the activation signal. line. Further, the drain of transistor Q3 is connected to the source of transistor Q4, and the drain of transistor Q8 is connected to the source of transistor Q9.

When the signal receiver is to be activated, transistors Q3 and Q8 are turned on by lowering the activation signal PSW at a low level to supply the electric power to transistors Q4, Q5, Q9 and Q10 constituting the body of the differential amplifier 103. On the other hand, when the signal receiver is not to be activated, the signal differential amplifier 103 is kept at a high impedance state, by raising the activation signal PSW at a high level.

Each of the sources of transistors Q5 and Q10 of the differential amplifier 103 is connected to the ground GND.

Figure 1A:
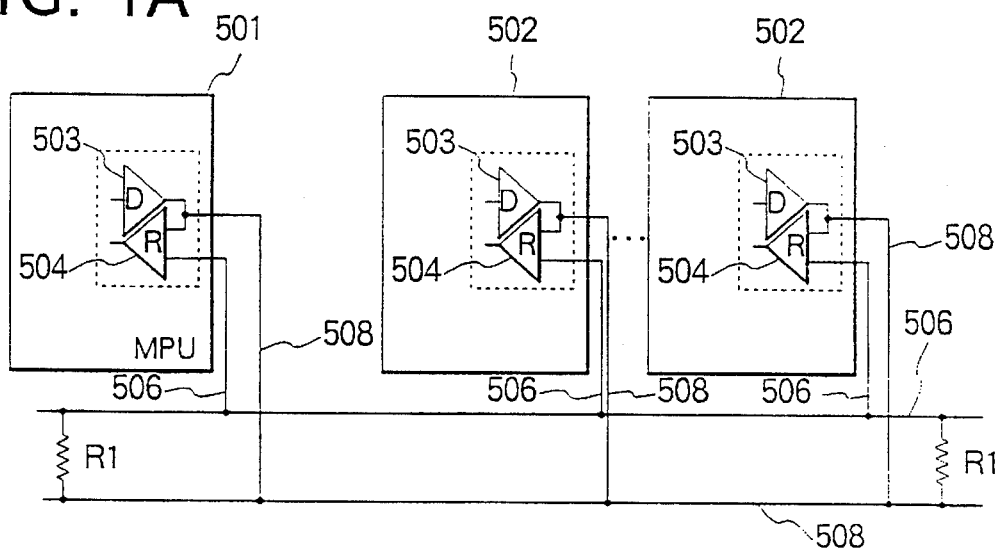
FIGS. 1A, 1B and 1C are circuit diagrams of a conventional interface, a driver and a signal receiver in the interface, respectively.
Figure 1B:
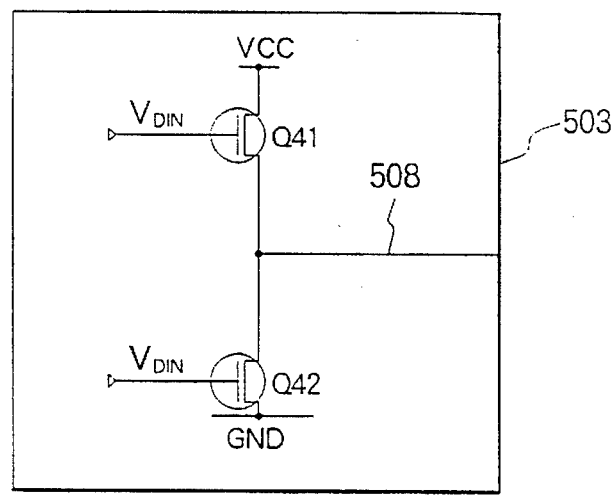

The gate of transistor Q5 is connected to the input/output line such as 508 in FIG. 1A, and an input signal $V_{in}$ is supplied thereto. A referential voltage supply line such as 506 in FIG. 1A is connected to the gate of transistor Q10, and the referential voltage $V_{ref}$ is supplied thereto. The drains of transistors Q9 and Q10 and the gates of transistors Q4 and Q9 are connected together, respectively. Both the drains of transistors Q4 and Q5 are connected together to an output 100 of the differential amplifier 103. The output 100 of the differential amplifier 103 is connected to the input of the inverter 101, the output 109 of which is connected to the internal circuit of corresponding one of memories and MPU in the system not shown, for providing thereto the output $V_{out}$ of the signal receiver.

Each of the first feed-back current path 104 and the second feed-back current path 105 is connected between the output 100 of the differential amplifier 103 and the corresponding one of supply lines $V_{cc}$ and GND. The first feedback current path 104 is comprised of p-ch transistors Q1 and Q2 connected in series. The source of transistor Q1 is connected to the power supply line $V_{cc}$, and the drain of transistor Q2 is connected to the output 100 of the differential amplifier 103. Further, the drain of transistor Q1 and the source of transistor Q2 are connected together. The output $V_{out}$ from the inverter 101 is connected to the gate of transistor Q1 through a first feedback path 108, and the gate of transistor Q2 is connected to the gate off transistor Q4 of the differential amplifier 103.

The second positive feedback section 105 is comprised of n-ch transistors Q6 and Q7 connected in series. The drain of transistor Q6 is connected to the output 100 of the differential amplifier 103, and the source of transistor Q7 is connected to the round GND. The source of transistor Q6 and the drain of transistor Q7 are connected together. The referential voltage supply line is connected to the gate of transistor Q6 so that the referential voltage $V_{ref}$ is supplied thereto. The output $V_{out}$ from the inverter 101 is connected to the gate of transistor Q7 through a second feedback path 109. Transistor Q1 is turned on when the output $V_{out}$ from the inverter 101 is at a low level, and turned off when it is at a high level. On the contrary, transistor Q7 is turned off when the output $V_{out}$ from the inverter 101 is at a low level, and turned on when it is at a high level.

Figure 1C:
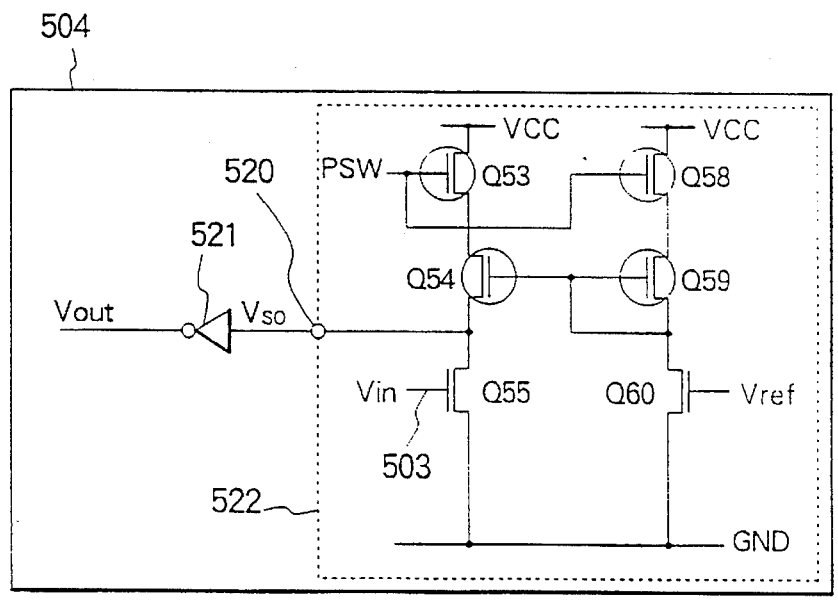

In the conventional receiver 504 of FIG. 1C, the output $V_{out}$ from the inverter 521 is activated or inactivated by an input signal $V_{in}$, with $V_{ref}'$ adjacent to the referential voltage $V_{ref}'$ being the trigger threshold, as illustrated by a dashed arrows in FIG. 3B. In detail, if the potential of an input signal $V_{in}$ is higher than the trigger threshold $V_{ref}'$ of FIG. 3B, the inverter 521 outputs a high level signal, while, if the potential of the input signal $V_{in}$ is lower than the trigger threshold $V_{ref}'$, the inverter 521 outputs a low level signal. In the present embodiment, however, the output $V_{out}$ of the inverter 101 has a hysteresis by providing a dead zone or neutral zone for the threshold within which the transient oscillation induced in the input signal $V_{in}$ is not sensed by the inverter 101.

The hysteresis characteristic of FIG. 3B is obtained by setting a lower trigger threshold of the signal receiver at $V_{THL}$, when the input signal $V_{in}$ rises from a lower level and setting a higher trigger threshold of the signal receiver at $V_{THH}$ when the input signal $V_{in}$ falls from a higher level. The lower trigger threshold $V_{THL}$ is determined to be lower than a minimum potential of $V_{in}$ during the transient oscillation, and the higher trigger threshold $V_{THH}$ is determined to be higher than a maximum potential of $V_{in}$ during the transient oscillation. By this configuration, the output $V_{out}$ from the inverter 101 can be kept at a high level or a low level depending on the level immediately before the transient oscillation, since the input potential $V_{in}$ does not rise above $V_{THH}$ or fall below $V_{THL}$ during the transient oscillation.

Next, a method for determining the trigger thresholds $V_{THL}$ and $V_{THH}$ of the signal receiver will be described with reference to FIGS. 4A, 4B and 4C showing waveforms of $V_{in}$, $V_{so}$ and $V_{out}$, respectively, during operation of the signal receiver.

In the present embodiment, a configuration is employed such that the level of the output signal $V_{so}$ from the differential amplifier 103 is shifted to a level closer to the supply potential $V_{cc}$ or closer to the ground potential GND as a whole so that the potential of the output $V_{so}$ of the differential amplifier during the transient oscillation does not cross the threshold level $V_{THI}$ at which the inverter of FIG. 3A operates. This configuration prevents the output $V_{out}$ of the inverter 101 from rising or falling due to the transient oscillation.

Assuming that the first positive feedback section 104 and 108 and the second positive feedback section 105 and 109 are omitted in FIG. 3A, it will be understood that the output $V_{so}$ is determined based on the ratio of the impedance of the first current path 106 to that of the second current path 107, in order to shift the level of the output $V_{so}$ of the differential amplifier 103. The first current path 106 is constituted by p-ch transistors Q3 and Q4 provided between the power supply line $V_{cc}$ and the output 100 of the differential amplifier 103. The second current path 107 is constituted by n-ch transistor Q,5 provided between the output 100 of the differential amplifier 103 and the ground line GND. Namely, if the impedance of the first current path 106 is smaller than that of the second current path 107, the level of the output $V_{so}$ of the differential amplifier 103 resides closer to the supply potential $V_{cc}$. On the other hand, if the impedance of the first current path 106 is larger than that of the second current path 107, the output $V_{so}$ resides closer to the ground potential GND. Further, if their impedances are equal to each other, the output $V_{so}$ resides at a half the supply potential $V_{cc}$.

Similarly, in the signal receiver of FIG. 3A including the first positive feedback section 104 and 108 and the second positive feedback section 105 and 109, if the impedance of a first combination branch 110 including the first current path 106 and the first feedback current path 104 is smaller than that of the second current path 107, the output $V_{so}$ from the differential amplifier resides at a potential level closer to the potential $V_{cc}$. Further, if the impedance of a second combination branch 111 including the second current path 107 and the second feedback current path 105 is smaller than that of the first current impedance 106, the output $V_{so}$ resides at a potential level closer to the ground potential GND.

In the present embodiment, the configuration is employed such that the first feed-back current path 104 is activated when the output $V_{out}$ from the inverter 101 is at a low level, and the level of the output $V_{so}$ from the differential amplifier 103 is shifted to a potential level closer to the potential $V_{cc}$ by making the impedance of the first combination branch 110 smaller than that of the second current path 107, so that the inverter 101 does not respond to the transient oscillation. This results in the higher trigger threshold $V_{THH}$.

Similarly, the configuration is such that the second positive feedback section 105 is activated when the output $V_{out}$ from the inverter 101 is at a high level, and that the level of the output $V_{so}$ from the differential amplifier 103 is shifted closer to the ground potential GND by making the impedance of the second combination branch 109 smaller than that of the first current path 106 so that the inverter 101 does not respond to the transient oscillation. This results in the lower trigger threshold $V_{THL}$.

Next, a method of obtaining the actual ratio of the impedance will be described.

In general, the transient oscillation has an amplitude which is one-fifth to one-third the amplitude of the input signal $V_{in}$ for the differential amplifier 103. That is, the potential difference between the maximum value and the minimum value of the transient oscillation is one-fifth to one-third the potential difference between a maximum input $V_{IH}$ and a minimum input $V_{IL}$ of the input $V_{in}$ shown in FIG. 3B. The ratio of the impedance of the first current path 106 to that of the first feedback current path 104 of the first combination branch 110 should be from approximately 1:2 to approximately 1:10 in order to set the higher trigger threshold $V_{THH}$ to a value whereby the output $V_{out}$ does not respond to the transient oscillation. In other words, a preferred impedance of the first feed-back current path 104 is approximately two to ten times that of the first current path 106. The ratio as specified was obtained by a simulation. Similarly, the impedance of the second feedback current path 106 should be approximately two to ten times that of the second current path 107 of the second combination branch 111, in order to obtain a preferred lower trigger threshold $V_{THL}$.

In operation, when a transient oscillation as shown in FIG. 4A is applied to the input of the signal receiver, signals of FIGS. 4B and 4C are obtained from the differential amplifier and the inverter, respectively. Namely, if the input signal $V_{in}$ including the transient oscillation as shown in FIG. 4A is input to the signal receiver, the output $V_{so}$ from the differential amplifier also includes a component of the transient oscillation. However, the amplitude of the transient oscillation in the output $V_{so}$ of the differential amplifier is not enough to reach or exceed the threshold level $V_{THH}$ of the inverter 101. Accordingly, the output $V_{out}$ from the inverter is fixed to the output level immediately before the start of the transient oscillation, as shown in FIG. 4C.

As described above, in the present embodiment, by providing the first positive feedback section and the second positive feedback section at the output of the differential amplifier of the signal receiver, and setting the threshold zone having an adequate hysteresis in transfer characteristic with respect to the input signal, even if the transient oscillation is induced in the input signal $V_{in}$, the output of the differential amplifier is not affected by the transient oscillation.

Figure 5A:
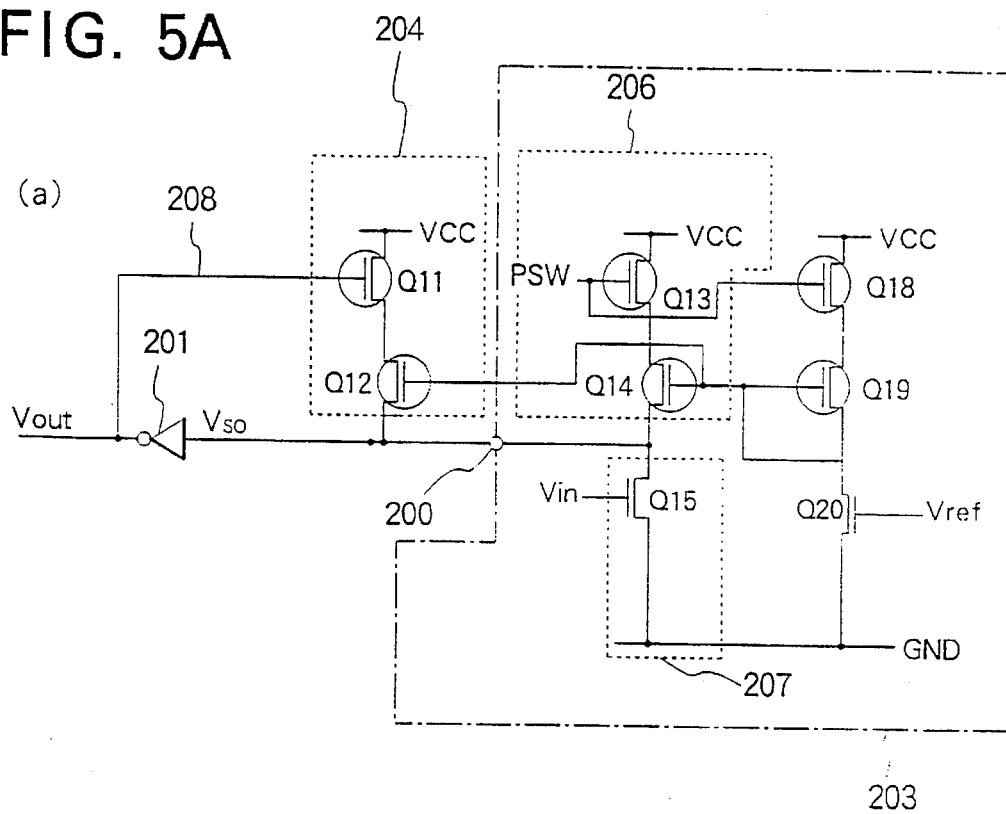
FIG. 5A is a schematic diagram of a signal receiver in an interface according to a second embodiment of the present invention.
Figure 5B:
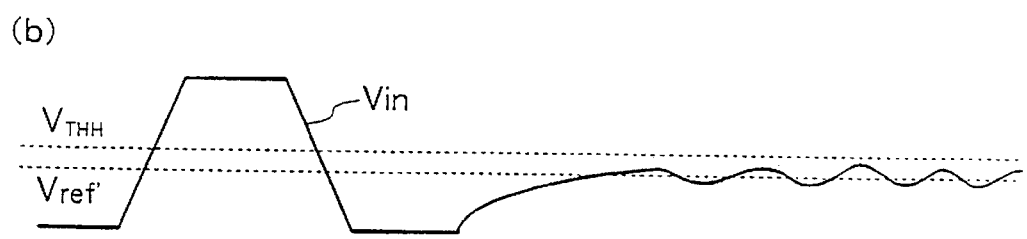
FIG. 5B is a timing chart of an input signal for the signal receiver of FIG. 5A, shown with respect to a trigger threshold $V_{THH}$.

FIG. 5A shows a signal receiver for an interface according to a second embodiment of the present invention, while FIG. 5B illustrates an input signal Vin shown with respect to a threshold $V_{THH}$.

As shown in FIG. 5A, in the present embodiment, a single feedback current path 204 to which the output $V_{out}$ of an inverter 201 is supplied through a feed-back signal path 208 is provided between the power supply line $V_{cc}$ and the output 200 of the differential amplifier 203. Here, the circuit configuration of transistors Q11 and Q12 constituting the first positive feedback section is similar to that of the transistors Q1 and Q2 of FIG. 3A constituting the first positive feedback section 104 in the first embodiment. Other circuit configurations of transistors Q18 through Q15 and Q18 through Q20 constituting the differential amplifier 203 are also similar to those of the transistors Q3 through Q5 and Q8 through Q10 of FIG. 3A constituting the differential amplifier 103 in the first embodiment. Furthermore, circuit configurations of the transistors Q13 and Q14 constituting the first current path 206 and the transistor Q15 constituting the second current path 207 are similar to those of the transistors Q3 and Q4 constituting the first current path 106 and the transistor Q5 of FIG. 3A constituting the second current path 107 in the first embodiment.

Even in those configurations, by setting a trigger threshold $V_{THH}$ similarly to the first embodiment, as shown in FIG. 5B, the output $V_{out}$ from the inverter is not affected by an input of the transient oscillation. In this case, even if the input signal $V_{in}$ includes a transient oscillation, with the center thereof being around the trigger threshold $V_{ref}'$ of the inverter 101, the output $V_{out}$ from the inverter is fixed to a low level, since there is no portion of the waveform exceeding the threshold $V_{THH}$ of the circuit.

Figure 6A:
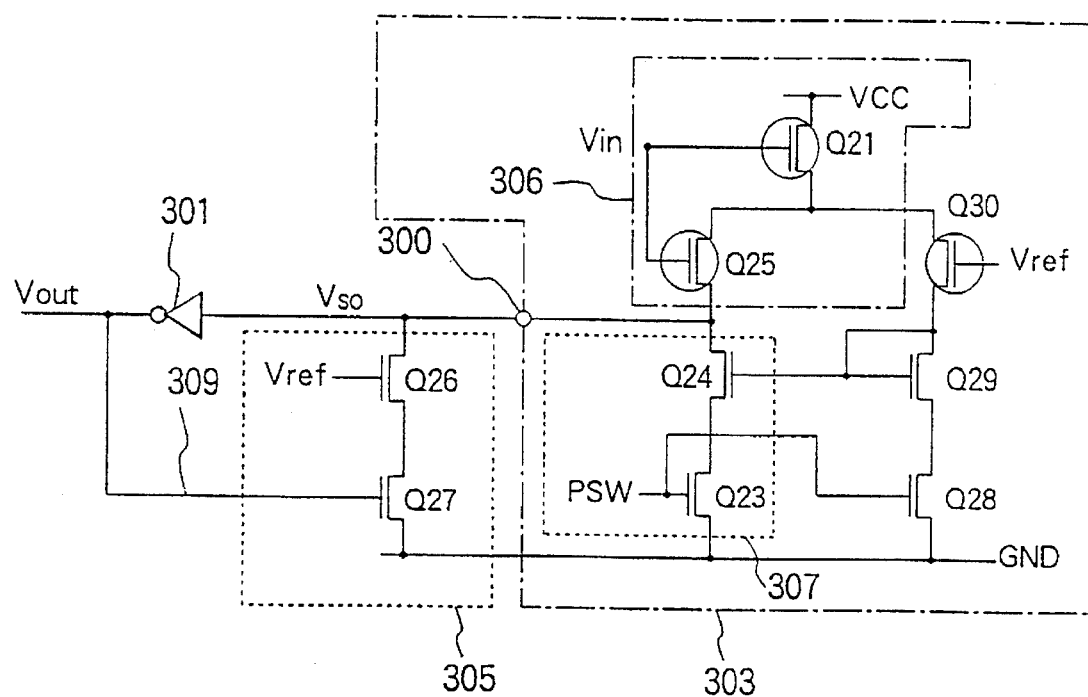
FIG. 6A is a schematic diagram of a signal receiver in an interface according to a third embodiment of the present invention.
Figure 6B:
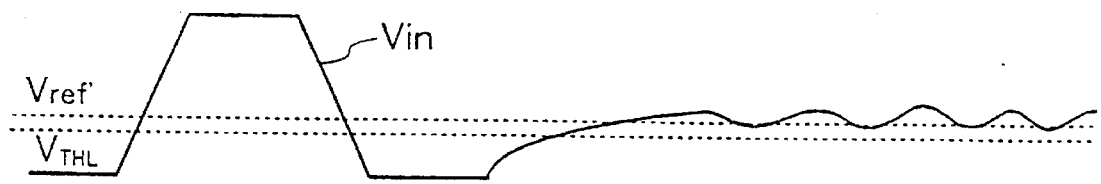
FIG. 6B is a timing chart of an input signal for the receiver of FIG. 6A, shown with respect to a trigger threshold $V_{THL}$.

FIG. 6A shows a signal receiver according to a third embodiment of the present invention, while FIG. 6B illustrates an input signal $V_{in}$ shown with respect to the thresholds.

In FIG. 6A, the signal receiver is formed such that a single feedback current path 305 to which the output $V_{out}$ of an inverter 301 is feed-backed through a feedback signal path 309 is provided between the ground line GND and the output 300 of a differential amplifier 303.

The circuit configuration of transistors Q26 and Q27 constituting the single positive feedback section 305 is similar to that of the transistors Q6 and Q7 of FIG. 3A constituting the second positive feedback section 105 and 108 in the first embodiment.

The differential amplifier 303 is comprised of switching transistors Q28 and Q28 controlled by an activation signal PSW, and transistors Q24, Q25, Q29, Q30 and Q21 constituting the body of the differential amplifier 303. Each of the sources of transistors Q23 and Q28 are connected to the ground GND, and each of the gates thereof is supplied with the activation signal PSW. Further, the drain of transistor Q23 is connected to the source of transistor Q24, and the drain of transistor Q28 is connected to the source of transistor Q29.

When the signal receiver is to be activated, the activation signal PSW is raised to a high level so that transistors Q23 and Q28 are turned on, thereby providing the electric power to the transistors Q24, Q25, Q29, Q30 and Q21 constituting the body of the differential amplifier. The source of transistor Q21 of the differential amplifier 303 is connected to the power supply line $V_{cc}$. Each of the sources of transistors Q25 and Q30 is connected to the drain of transistor Q21. An input/output line is connected to the gates of transistors Q21 arid Q25, and an input signal $V_{in}$ is supplied thereto. A referential voltage supply line is connected to the gate of transistor Q30, and the referential voltage $V_{ref}$ is supplied thereto. Further, the drains of transistors Q30 and Q29 and the gates of transistors Q29 and Q24 are connected together. The drains of transistors Q24 and Q25 are connected to the output 300 of the differential amplifier 303.

Even in those configurations, by setting the threshold $V_{THL}$ of the circuit similarly to the first embodiment, as shown in FIG. 6B, the output $V_{out}$ from the inverter 301 is not affected by the input of the transient oscillation. In this case, even if the input $V_{in}$ includes the transient oscillation, with the center thereof being around the threshold $V_{ref}'$ of the inverter, the output $V_{out}$ from the inverter 301 is fixed to a high level, since there is no portion of the waveform in $V_{in}$ going below the threshold $V_{THL}$ of the circuit.

Figure 7:
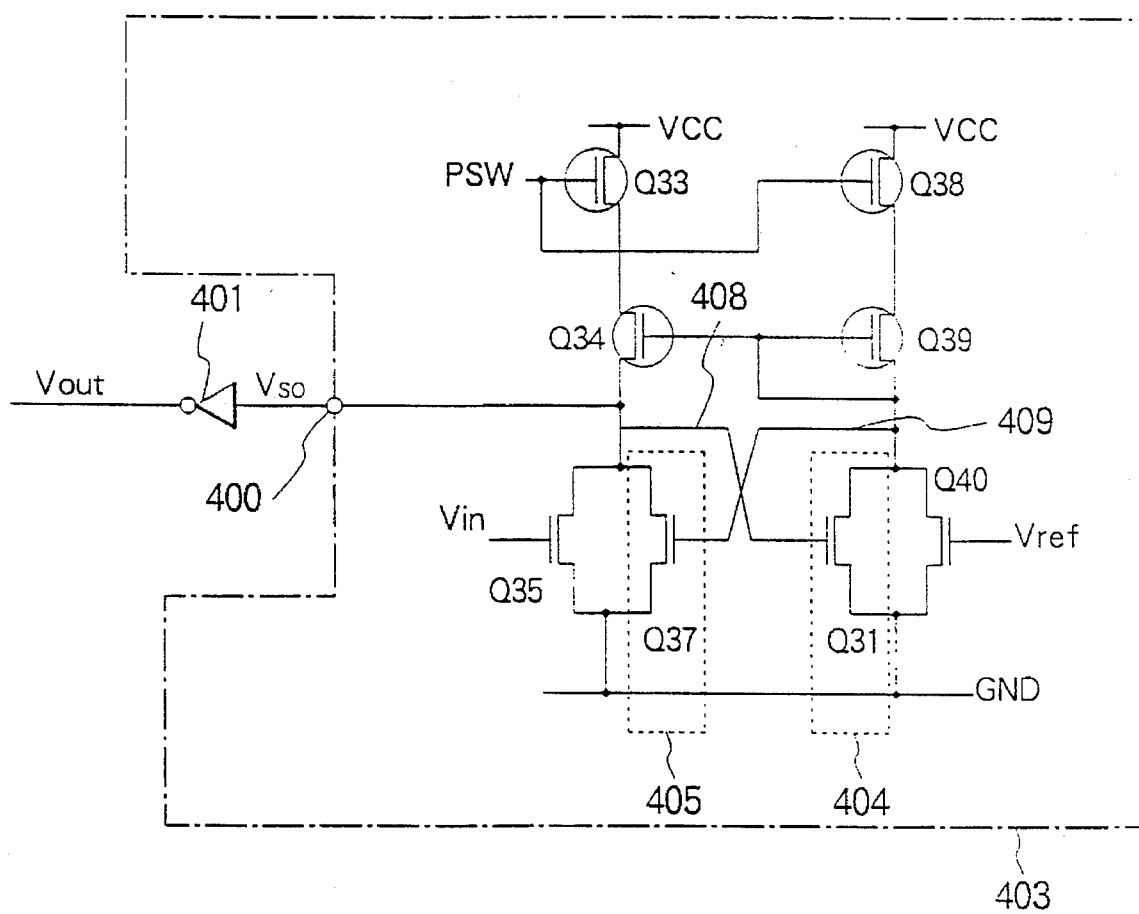
FIG. 7 is a schematic diagram of a signal receiver in an interface according to a fourth embodiment of the present invention.

FIG. 7 shows a signal receiver for an interface according to a fourth embodiment of the present invention.

In FIG. 7, circuit configurations of transistors Q33 through Q35 and Q38 through Q40 constituting the body of a differential amplifier 403 are similar to those of the transistors Q3 through Q5 and Q8 through Q10 in the first embodiment. Transistor Q31 constituting a first feed-back current path 404 and transistor Q37 constituting a second feedback current path 405 are provided in the differential amplifier 403. The drain and source of transistor Q31 are connected to the drain and source of transistor Q40, respectively. The output 400 of the differential amplifier 403 is connected to the gate of transistor Q31 through a first feedback signal path 408. Further, the drain and source of transistor Q37 are connected to the drain and source of transistor Q35, respectively. The drain of transistor Q40 is connected to the gate of transistor Q37 through a second feedback signal path 409.

In those configurations of the fourth embodiment, if the input $V_{in}$ is lower than the referential voltage $V_{ref}$, transistor Q31 of the first feedback current path 404 is turned on, thereby lowering the voltage across transistor Q40. Accordingly, the impedance of transistor Q37 of the second positive feedback section 405 and 409 is increased by the fall of the voltage level of the second feedback signal path 409. As a result, the output $V_{so}$ from the differential amplifier 403 can be shifted toward the potential level $V_{cc}$. The trigger threshold $V_{THH}$ of the receiver can be determined similarly to the first embodiment. If the input $V_{in}$ is higher than the referential voltage $V_{ref}$, transistor Q31 of the first positive feedback section 404 and 408 is turned off, thereby raising the voltage across transistor Q40. Accordingly, the impedance of transistor Q37 of the second positive feedback section 405 and 409 is reduced by the rise of the voltage level of the second feedback signal path 409. As a result, the output $V_{so}$ from the differential amplifier can be shifted toward the ground potential GND. The trigger threshold $V_{THL}$, can be determined similarly to the first embodiment. Thus, in the fourth embodiment, it is possible to determine the trigger thresholds $V_{THH}$ and $V_{THL}$ of the signal receiver with a fewer parts as compared to the embodiments as described before.

The feedback signal path in each of the embodiments described above is not necessarily connected directly to the output of the inverter. It is possible that the feedback signal path is connected to the output having an input directly or indirectly connected to the output of the inverter. Further, each of the embodiments described above is described as using FETs as the transistors constituting the signal receiver. However, the signal receiver according to the present invention can be formed by using bipolar transistors.

Since above embodiments are described only for examples, the present invention is not limited to such embodiments and it will be obvious for those skilled in the art that various modifications or alterations can be easily made based on the above embodiments within the scope of the present invention.

What is claimed is:

1. A signal receiver for an interface comprising:
   a differential circuit including a first first-conductivity type transistor having a gate, a source connected to a first potential line and a drain connected to said gate;
   a first second-conductivity type transistor having a gate for receiving a reference voltage, a source connected to a second potential line and a drain connected to said drain of said first first-conductivity type transistor;
   a second first-conductivity type transistor having a gate connected to said gate of said first first-conductivity type transistor, a source connected to said first potential line and a drain connected to a first signal line;
   a second second-conductivity type transistor having a gate for receiving an input signal, a source connected to said second potential line and a drain connected to said drain of said second first-conductivity type transistor;
   an inverter having an input connected to said first signal line and an output connected to a second signal line; and
   a feedback section including
      a third first-conductivity type transistor having a gate connected to said second signal line, a source connected to said first potential line and a drain, and
      a fourth first-conductivity type transistor having a gate connected to said gate of said second first-conductivity type transistor, a drain connected to said first signal line and a source connected to said drain of said third first-conductivity type transistor.

2. The signal receiver as defined in claim 1, further comprising a first and a second switching means, wherein said drains of said first and second first-conductivity type transistors are connected to said first potential line through said first and second switching means, respectively.

3. The signal receiver as defined in claim 1, wherein said feedback section further includes a third second-conductivity type transistor having a gate connected to said second signal line, a source connected to said second potential line and a drain, and a fourth second-conductivity type transistor having a gate for receiving said reference voltage, a source connected to said drain of said third second-conductivity type transistor and a drain connected to said first signal line.

4. A signal receiver for an interface comprising:
   a differential circuit including a first first-conductivity type transistor having a gate, a source connected to a first potential line and a drain connected to said gate;
   a first second-conductivity type transistor having a gate for receiving a reference voltage, a source connected to a second potential line and a drain connected to said drain of said first first-conductivity type transistor;
   a second first-conductivity type transistor having a gate connected to said gate of said first first-conductivity type transistor, a source connected to said first potential line and a drain connected to a first signal line;
   a second second-conductivity type transistor having a gate for receiving an input signal, a source connected to said second potential line and a drain connected to said drain of said second first-conductivity type transistor; and
   a feedback section including
      a third second-conductivity type transistor having a gate connected to said first signal line, a source connected to said source of said first second-conductivity type transistor and a drain connected to said drain of said first second-conductivity type transistor, and
      a fourth second-conductivity type transistor having a gate connected to said drain of said first first-conductivity type transistor, a source connected to said source of said second second-conductivity type transistor and a drain connected to said drain of said second second-conductivity type transistor.

5. The signal receiver as defined in claim 4, further comprising a first and a second switching means, wherein said sources of said first and second first-conductivity type transistors are connected to said first potential line through said first and second switching means, respectively.

* * * * *